(12) United States Patent
Lin et al.

(10) Patent No.: US 10,535,627 B2
(45) Date of Patent: Jan. 14, 2020

(54) PRINTING MODULE, PRINTING METHOD AND SYSTEM OF FORMING A PRINTED STRUCTURE

(71) Applicant: Taiwan Semiconductor Manufacturing Co., Ltd., Hsinchu (TW)

(72) Inventors: Jing-Cheng Lin, Hsinchu (TW); Li-Hui Cheng, New Taipei (TW); Po-Hao Tsai, Taoyuan County (TW); Chih-Chien Pan, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/218,495

(22) Filed: Dec. 13, 2018

(65) Prior Publication Data

US 2019/0123015 A1    Apr. 25, 2019

Related U.S. Application Data

(62) Division of application No. 15/499,901, filed on Apr. 28, 2017, now Pat. No. 10,163,848.

(51) Int. Cl.
*H01L 21/00*     (2006.01)
*H01L 23/00*     (2006.01)
(Continued)

(52) U.S. Cl.
CPC ............ *H01L 24/81* (2013.01); *H01L 21/561* (2013.01); *H01L 21/6715* (2013.01);
(Continued)

(58) Field of Classification Search
CPC .............. H01L 21/561; H01L 21/6715; H01L 21/67207; H01L 24/81; H01L 24/14; H01L 24/73; H01L 24/97; H01L 24/24; H01L 24/25; H01L 24/02; H01L 24/13; H01L 24/19; H01L 24/20; H01L 25/105; H01L 25/50; H01L 25/0753; H01L 2224/10145; H01L 2224/14181; H01L 2224/81007;
(Continued)

(56) References Cited

U.S. PATENT DOCUMENTS 9,000,584 B2   4/2015  Lin et al.
9,048,222 B2   6/2015  Hung et al.
(Continued)

*Primary Examiner* — Nikolay K Yushin
(74) *Attorney, Agent, or Firm* — JCIPRNET

(57) ABSTRACT

A printing module, printing method and system of forming a printed structure are provided. The printing module includes a first printing dispenser operable to dispense a first material, a second printing dispenser operable to dispense a second material, a first curing unit, a second curing unit and a third curing unit. The first, the second and the third curing units each is operable to irradiate a light capable of curing the first and second materials and are alternately arranged with the first and second printing dispensers along a line. The first and second printing dispensers and the first, second and third curing units are simultaneously movable along the line. During the second curing unit and one of the first curing unit and the third curing unit are operable to irradiate the light, the other of the first curing unit and the third curing unit is off.

20 Claims, 15 Drawing Sheets

(51) Int. Cl.
*H01L 25/10* (2006.01)
*H01L 21/56* (2006.01)
*H01L 21/67* (2006.01)
*H01L 25/00* (2006.01)
*H01L 21/683* (2006.01)

(52) U.S. Cl.
CPC .... *H01L 21/67207* (2013.01); *H01L 21/6836* (2013.01); *H01L 24/02* (2013.01); *H01L 24/13* (2013.01); *H01L 24/14* (2013.01); *H01L 24/19* (2013.01); *H01L 24/20* (2013.01); *H01L 24/24* (2013.01); *H01L 24/25* (2013.01); *H01L 24/73* (2013.01); *H01L 24/97* (2013.01); *H01L 25/105* (2013.01); *H01L 25/50* (2013.01); *H01L 2221/68331* (2013.01); *H01L 2224/02379* (2013.01); *H01L 2224/04105* (2013.01); *H01L 2224/10145* (2013.01); *H01L 2224/12105* (2013.01); *H01L 2224/13024* (2013.01); *H01L 2224/14181* (2013.01); *H01L 2224/24146* (2013.01); *H01L 2224/25171* (2013.01); *H01L 2224/32145* (2013.01); *H01L 2224/32225* (2013.01); *H01L 2224/73259* (2013.01); *H01L 2224/73267* (2013.01); *H01L 2224/81007* (2013.01); *H01L 2224/95001* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2225/1082* (2013.01); *H01L 2924/1433* (2013.01); *H01L 2924/15311* (2013.01); *H01L 2924/18162* (2013.01); *H01L 2924/3511* (2013.01)

(58) Field of Classification Search
CPC . H01L 2224/13024; H01L 2224/73259; H01L 2224/25171; H01L 2224/02379; H01L 2224/24146; H01L 2224/95001; H01L 2224/04105; H01L 2224/12105; H01L 2224/32145; H01L 2224/32225; H01L 2224/73267; H01L 2224/97; H01L 2224/83; H01L 2225/06568; H01L 2225/1035; H01L 2225/1058; H01L 2225/0651; H01L 2225/1082; H01L 2924/3511; H01L 2924/15311; H01L 2924/18162
See application file for complete search history.

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,064,879 B2 | 6/2015 | Hung et al. | |
| 9,099,575 B2 * | 8/2015 | Medendorp, Jr. | ... H01L 33/0095 |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2015/0021628 A1 * | 1/2015 | Medendorp, Jr. | ... H01L 33/0095 257/88 |

* cited by examiner

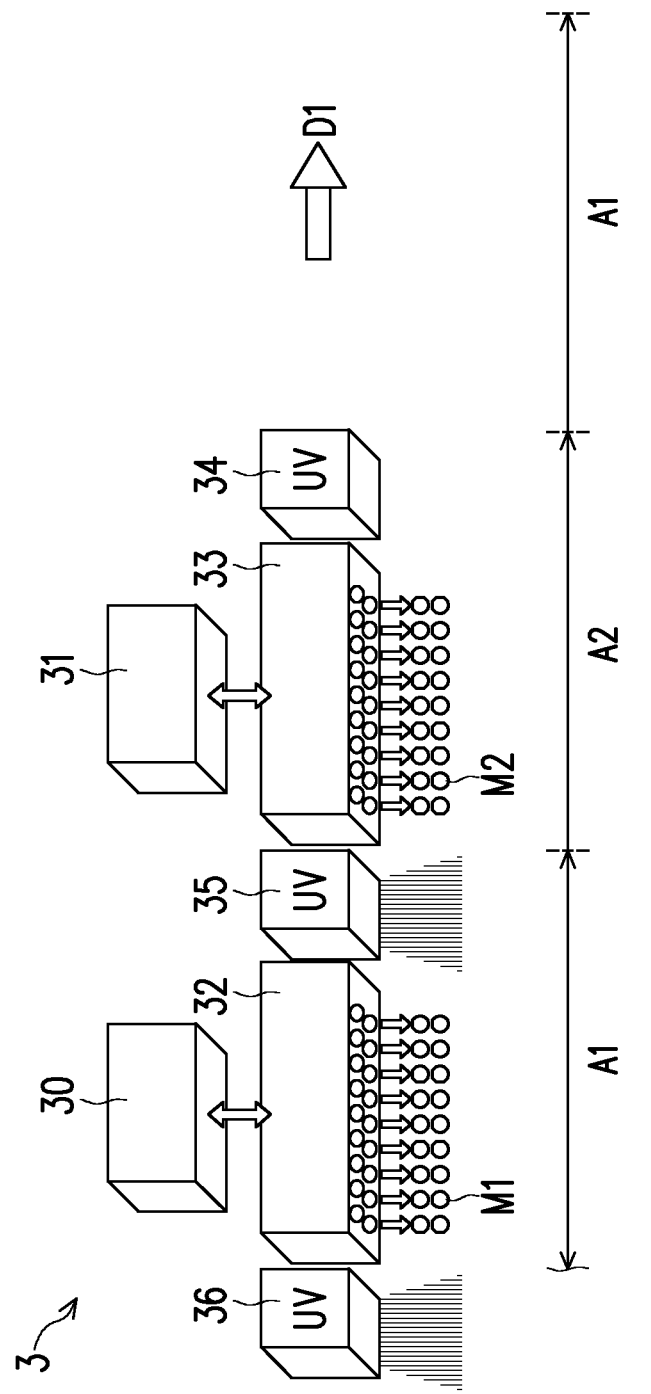

PRINTING MODULE, PRINTING METHOD AND SYSTEM OF FORMING A PRINTED STRUCTURE

CROSS-REFERENCE TO RELATED APPLICATION

This application is a divisional of and claims the benefit of a U.S. application Ser. No. 15/499,901, filed Apr. 28, 2017, now allowed. The entirety of each of the above-mentioned patent applications is hereby incorporated by reference herein.

BACKGROUND

Package-on-package wafer level packaging technology has the potentials to satisfy the urges of size reduction, high performance interconnects and better thermal management for future packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3D are schematic cross sectional views of various stages in a manufacturing method of a semiconductor package according to some exemplary embodiments of the present disclosure.

DETAILED DESCRIPTION

Figure 1A:
FIG. 1A to FIG. 1L' are schematic cross sectional views of various stages in a manufacturing method of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L' are schematic cross sectional views of various stages in a manufacturing method of a semiconductor package according to some exemplary embodiments. FIG. 1M is a schematic partially enlarged top view of the semiconductor package according to some exemplary embodiments. In exemplary embodiments, the semiconductor manufacturing method is part of a wafer level packaging process. In some embodiments, two dies are shown to represent plural dies of the wafer, and one or more packages are shown to represent plural semiconductor packages obtained following the semiconductor manufacturing method.

Referring to FIG. 1A, in some embodiments, a carrier 102 is provided, the carrier 102 may be a glass carrier or any suitable carrier for the manufacturing method of the semiconductor package. In some embodiments, the carrier 102 is provided with a debond layer 104 coated thereon, and the debond layer 104 may be a light-to-heat conversion ("LTHC") layer or using any material suitable for debonding the carrier 102 from the above layers or wafer disposed thereon. Referring to FIG. 1A, in some embodiments, an adhesive layer 106 is formed on the debond layer 104 over the carrier 102. The adhesive layer 106 includes, for example, a ultra-violet curable adhesive, a heat curable adhesive, an optical clear adhesive or the like. In some embodiments, as shown in FIG. 1A, a seed layer 108 is formed on the adhesive layer 106. In certain embodiments, the seed layer 108 is a multilayered structure and the seed layer 108 is formed by sputtering or depositing a titanium layer and a copper seed layer sequentially on the adhesive layer 106 over the carrier 102. In some embodiments, the adhesive layer 106 is optional and the seed layer 108 may be formed directly on the debond layer 104.

Figure 1B:
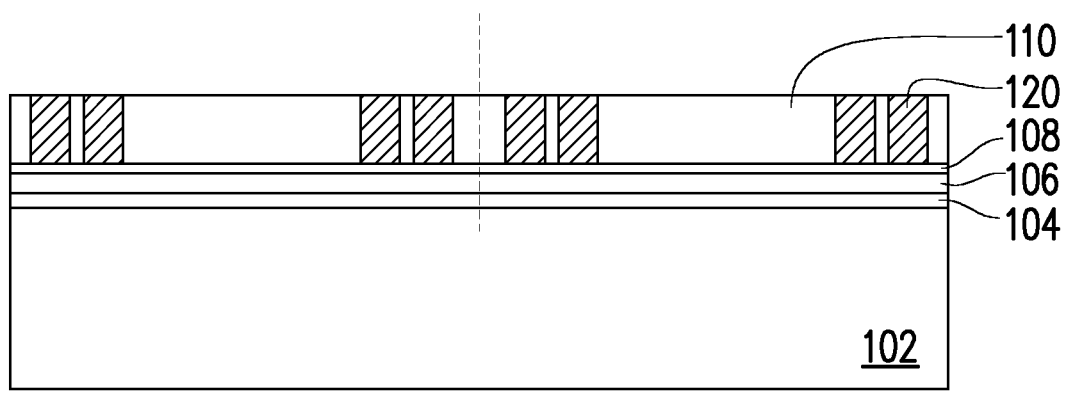

Referring to FIG. 1B, in some embodiments, through interlayer vias ("TIVs") 120 are formed on the seed layer 108 over the carrier 102. In some embodiments, the TIVs 120 are through integrated fan-out ("InFO") vias. In some embodiments, the TIVs 120 are formed by forming a mask pattern 110 with openings on the seed layer 108 and forming a metal material (not shown) filling up the openings of the mask pattern 110 to form the TIVs 120 on the seed layer 108 by electroplating or deposition. In certain embodiments, the material of the TIVs 120 includes copper or copper alloys formed by electroplating.

Figure 1C:
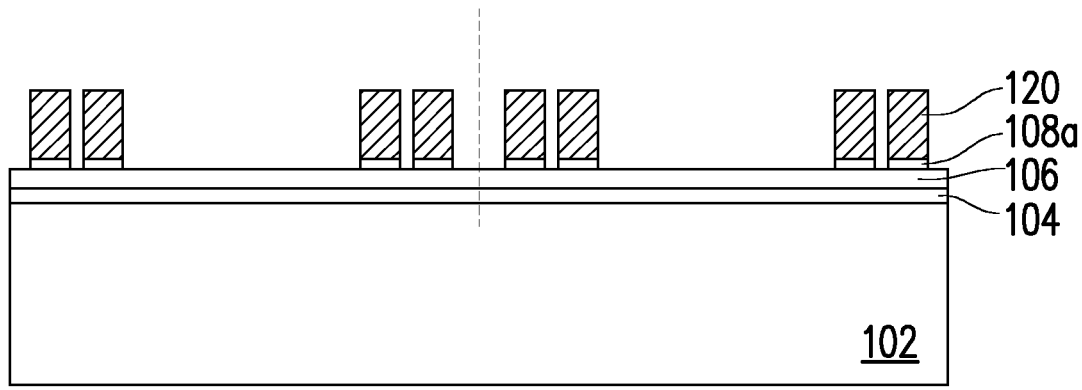

Referring to FIG. 1C, after removing the mask pattern 110, the seed layer 108 is patterned using the TIVs 120 as the masks to form the seed pattern 108a exposing portions of the adhesive layer 106. In some embodiments, the patterning of the seed layer 108 includes performing at least one anisotropic or isotropic etching process. However, it is appreciated that the scope of this disclosure is not limited to the materials and descriptions disclosed above.

Figure 1D:
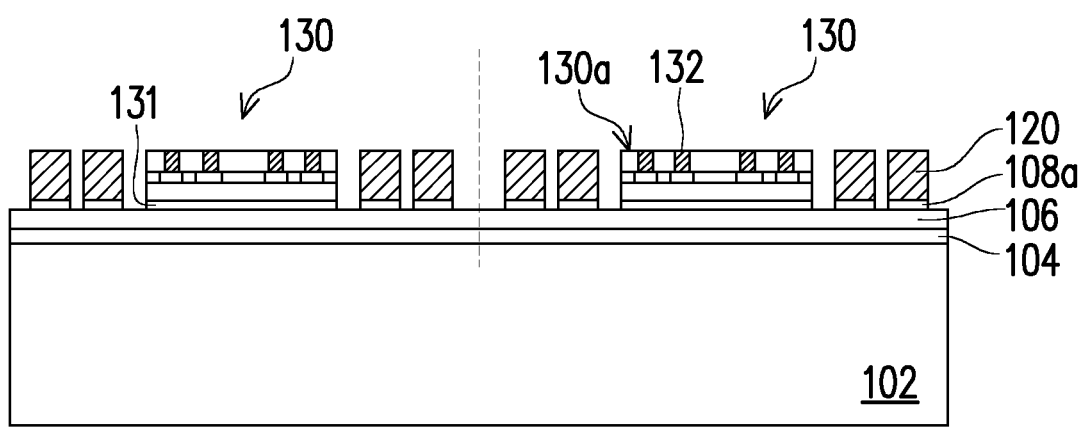

Referring to FIG. 1D, first dies 130 are provided and placed on the exposed adhesive layer 106 on the carrier 102. In exemplary embodiments, the first dies 130 are the same types of dies and the dies may be memory chips, application-specific integrated circuit chips, analog chips, sensor chips, wireless and radio frequency chips, microprocessor chips or voltage regulator chips. In other embodiments, the first dies 130 may include different types of dies. In certain embodiment, a die attach film 131 may be provided between the first dies 130 and the adhesive layer 106 for better adhering. In certain embodiment, as shown in FIG. 1D, active surfaces 130a of the first dies 130 includes contacts 132 and backsides of the first dies 130 are attached to the carrier 102. In some embodiments, the first dies 130 are placed over the carrier 102 and arranged aside the TIVs 120 (within the area surrounding by the TIVs 120). In some embodiments, as shown in FIG. 1D, the dotted line represents a cutting line of package units 10 (see FIG. 1L'), and some of the TIVs 120 around the first dies 130 are arranged close to but not on the cutting line.

Figure 1E:
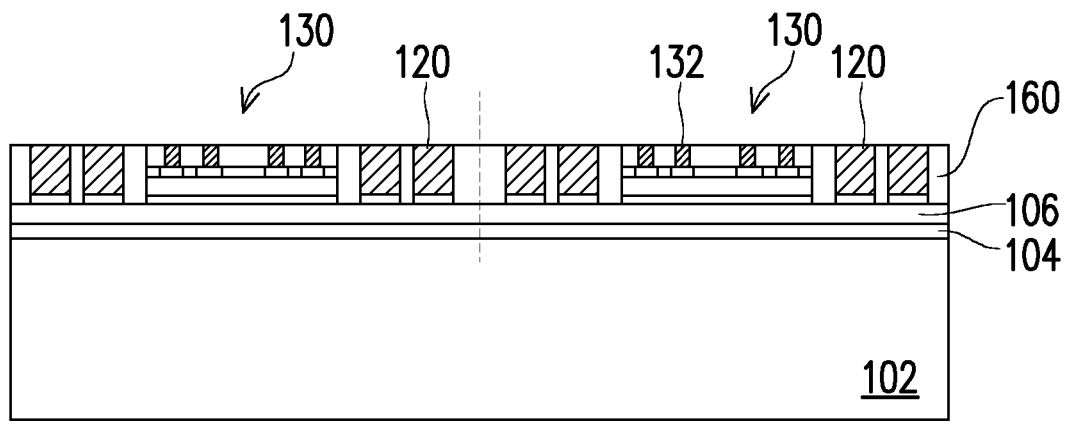

Referring to FIG. 1E, in some embodiments, the first dies 130 and the TIVs 120 located over the carrier 102, and the first dies 130 are molded and encapsulated in a molding compound 160. In one embodiment, the molding compound 160 fills the space between the first dies 130 and the TIVs 120, and covers the adhesive layer 106. In one embodiment, the molding compound 160 may be formed by the overmolding process and the formed molding compound 160 covers the entirety of the first dies 130 and the TIVs 120. In some embodiments, the material of the molding compound 160 includes epoxy resins, phenolic resins or silicon-containing resins.

Referring to FIG. 1E, in some embodiments, the overmolded molding compound 160 and the TIVs 120 are planarized or polished until the TIVs 120 and the contacts 132 of the first dies 130 are exposed. In some embodiments, the molding compound 160 and the TIVs 120 are planarized through a grinding process or a chemical mechanical polishing process.

Figure 1F:
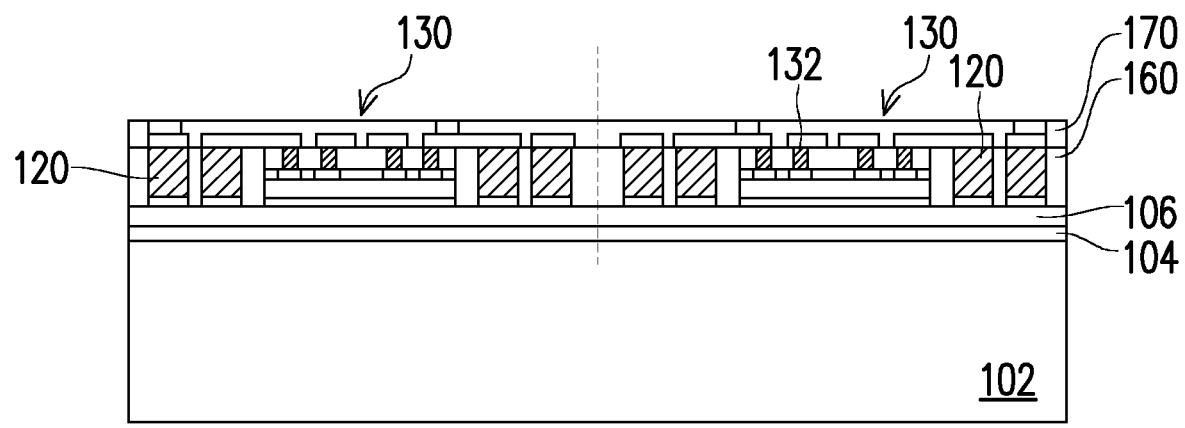

Referring to FIG. 1F, in some embodiments, a redistribution layer 170 is formed on the planarized molding compound 160, over the first dies 130 and on the TIVs 120. In some embodiment, the redistribution layer 170 is physically and electrically connected to the TIVs 120 and the contacts 132 of the first dies 130. The formation of the redistribution layer 170 includes sequentially forming one or more polymer dielectric material layers and one or more metallization layers in alternation. In some embodiments, the material of the metallization layer(s) includes aluminum, titanium, copper, nickel, tungsten, and/or alloys thereof. In some embodiments, the material of the polymer dielectric material layer(s) includes polyimide, benzocyclobutene, polybenzooxazole, or any other suitable polymer-based dielectric material. In some embodiments, the redistribution layer 170 is a front-side redistribution layer electrically connected to the first dies 130 and is electrically connected to the TIVs 120.

Figure 1G:
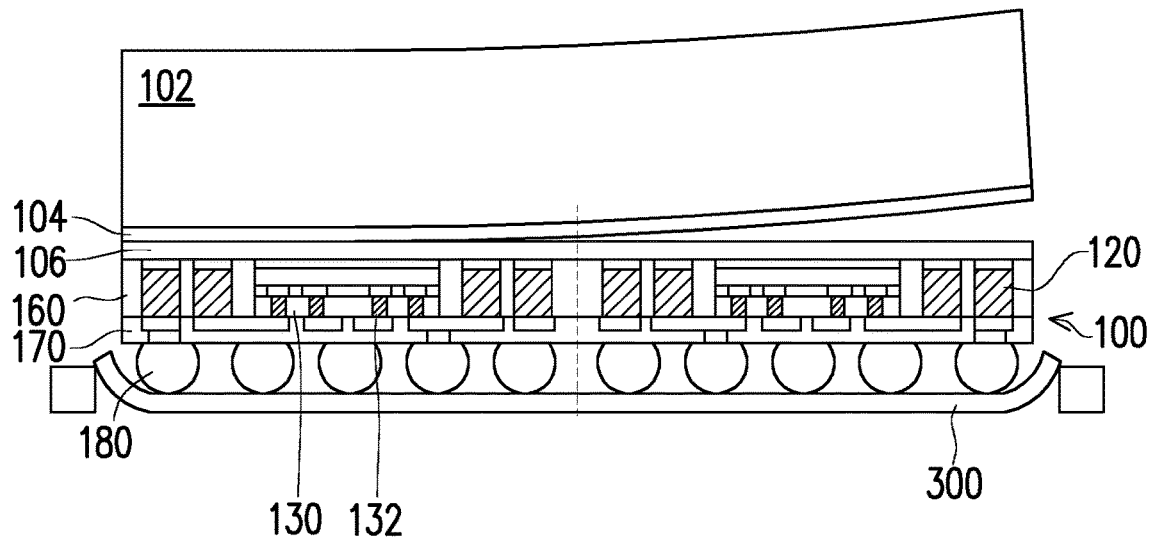

Referring to FIG. 1G, in some embodiments, conductive elements 180 are disposed on the redistribution layer 170 and are electrically connected to the redistribution layer 170. In some embodiments, the conductive elements 180 are, for example, solder balls or ball grid array ("BGA") balls placed on the redistribution layer 170. In some embodiments, the conductive 180 may be disposed on under bump metal (UBM) pads (not shown). In some embodiments, some of the conductive elements 180 are electrically connected to the first dies 130 through the redistribution layer 170, and some of the conductive elements 180 are electrically connected to the TIVs 120 through the redistribution layer 170.

Referring to FIG. 1G, in some embodiments, the whole package 100, including the first dies 130, TIVs 120 and the molding compound 160, is turned upside down and disposed on a carrier film 300. Afterwards, the package 100 is detached from the carrier 102 and the debond layer 104. The first dies 130 are separated from the carrier 102.

Figure 1H:
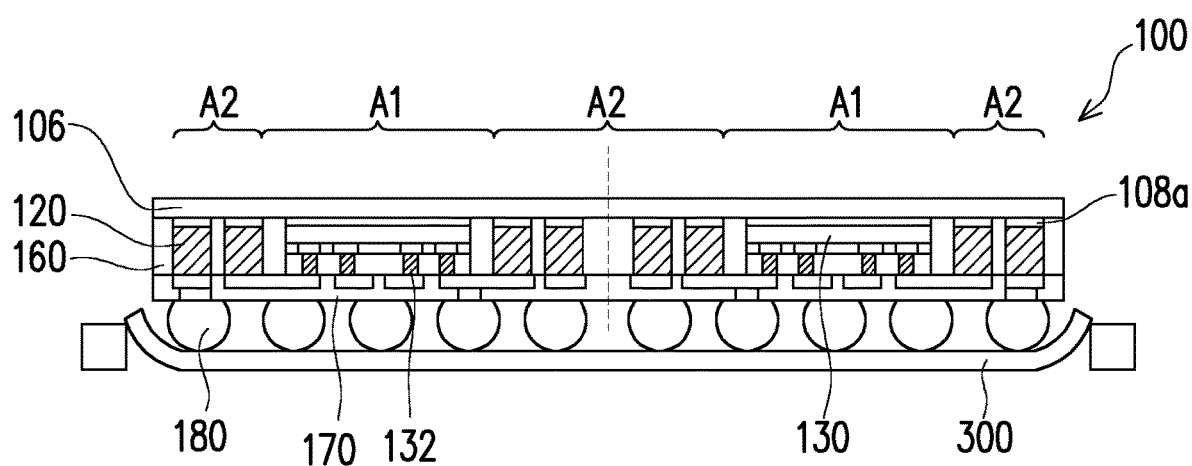

In some embodiments, as shown in FIG. 1H, after debonding from the carrier 102, the adhesive layer 106 is exposed. In some embodiments, the regions where the first dies 130 are disposed are first regions A1 of the package 100, while the regions where the TIVs 120 are located are second regions A2 of the package 100. In exemplary embodiments, the first regions A1 are central or device regions, while the second regions A2 are connection or peripheral regions of the package structure.

Figure 1I:
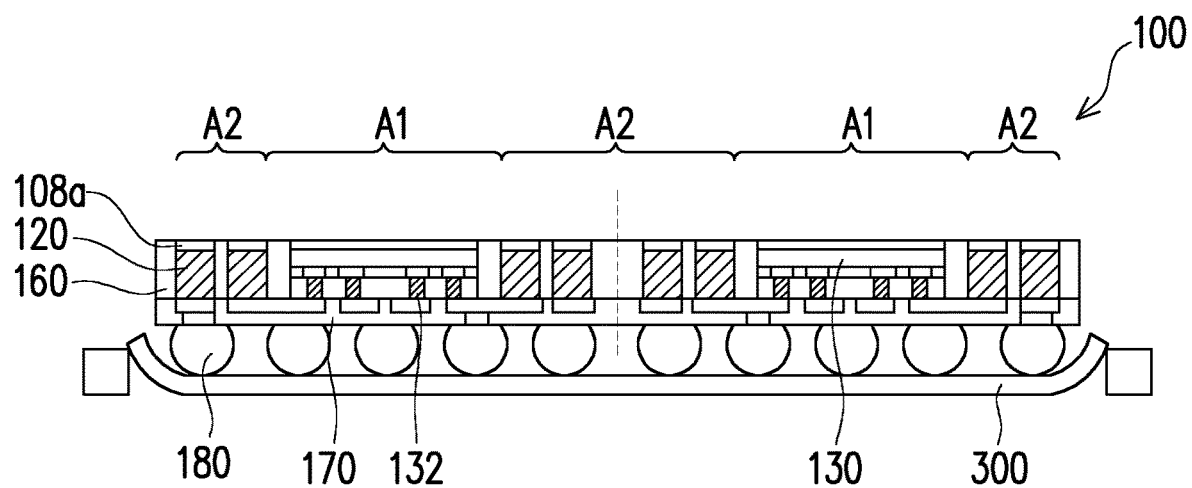

Referring to FIG. 1I, in some embodiments, the adhesive layer 106 is removed to expose the TIVs 120 (or the seed layer 108a of the TIVs 120) by etching, peeling or performing a laser process and/or a cleaning process. In some embodiments, only the adhesive layer 106 on TIVs 120 is removed to form open pads by a patterning process (such as, a laser drilling process).

Figure 1J:
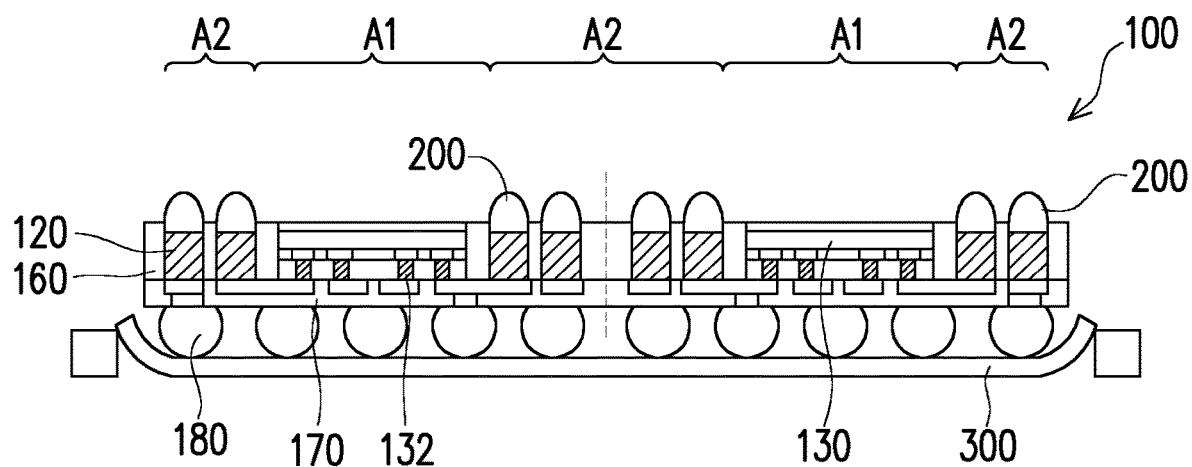

Referring to FIG. 1J, in some embodiments, connectors 200 are respectively formed on the TIVs 120 in the second regions A2. In certain embodiments, the connectors 200 are solder bumps formed by performing a solder on pad ("SOP") process. In some embodiments, prior to disposing the connectors 200, flux may be applied so that the connectors 200 are better fixed to the seed layer 108a or the TIVs 120. For illustration purposes, after the formation of the connectors, the thin seed layer is omitted in the following figures. In exemplary embodiments, the connectors 200 are located right on the TIVs 120 respectively.

Figure 1K:
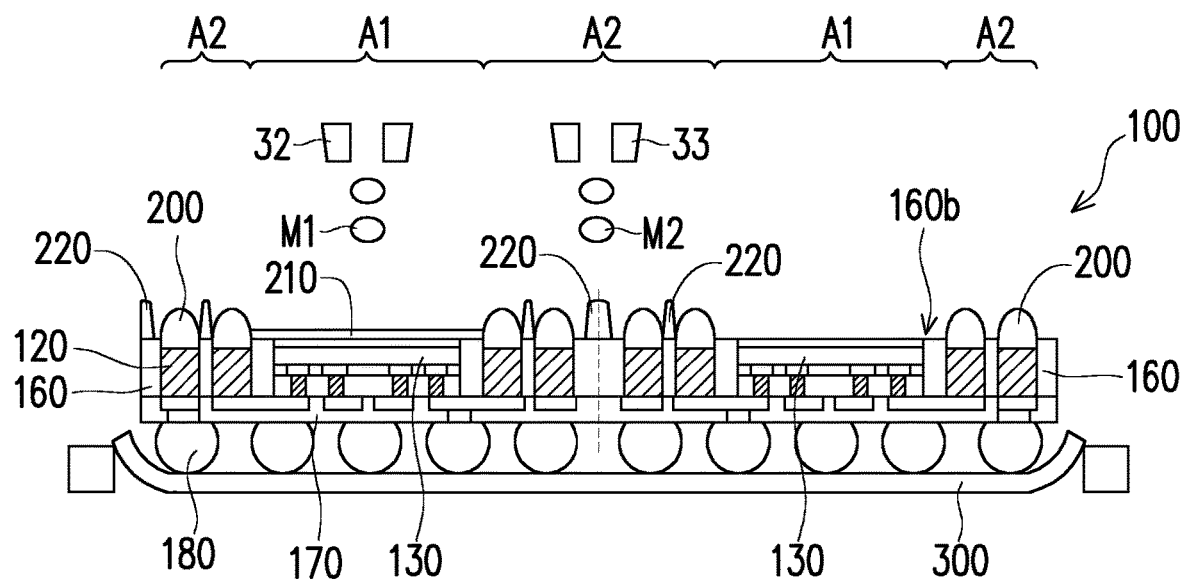
Figure 1L:
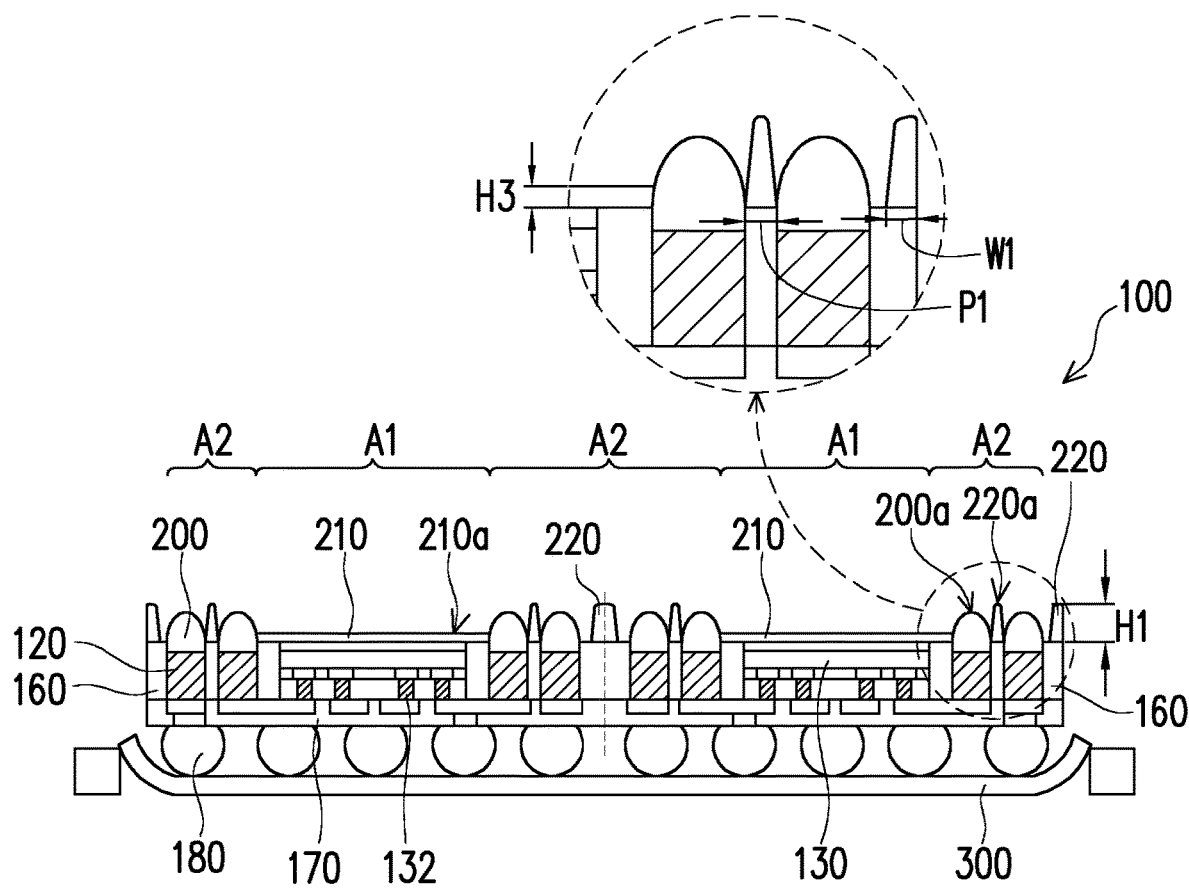
Figure 1L:
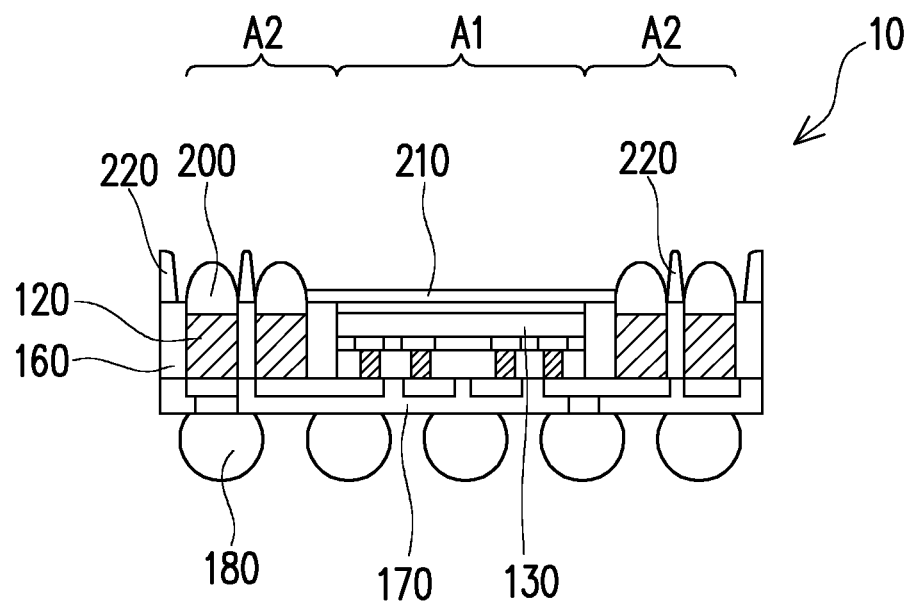
Figure 1M:
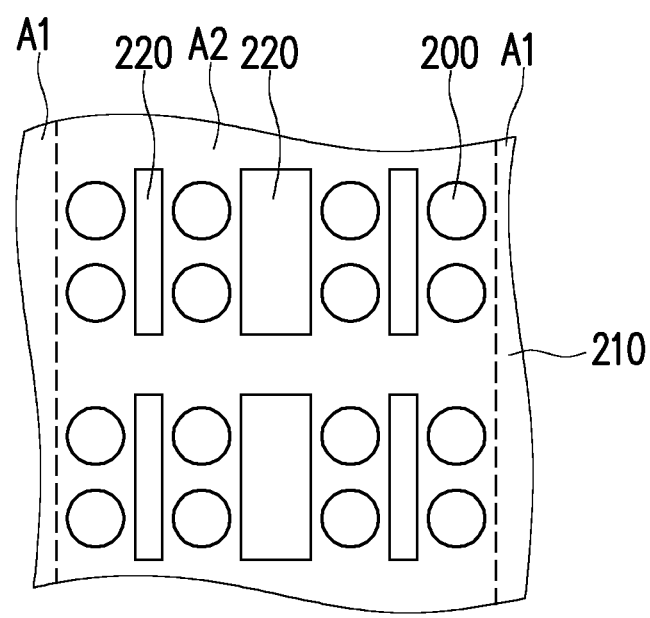
FIG. 1M is a schematic partially enlarged top view of the semiconductor package according to some exemplary embodiments.

Referring to FIGS. 1K-1L, in some embodiments, polymeric cover films 210 are formed on the first dies 130 and polymeric dam structures 220 are formed respectively between the connectors 200, and then the polymeric cover films 210 and polymeric dam structures 220 are cured. In certain embodiments, the polymeric cover films 210 are formed by printing in the first regions A1 to cover the backsides of the first dies 130. In certain embodiment, the printing process includes an inkjet printing process. In some embodiments, the polymeric cover films 210 are disposed mainly on the first dies 130, which provide protection and isolation for the dies and further strengthen the thin package structure for preventing warpage. That is, the polymeric cover films 210 are arranged locally in specific regions (i.e., the first regions A1) and are formed on and above the first dies 130, rather than being formed as a blanket layer over the wafer. In some embodiments, the polymeric cover films 210 are mainly formed within the first regions A1 but may be in contact with the connectors 200 if overflown to the margins of the second regions A2. In certain embodiments, the polymeric dam structures 220 are formed in the second regions A2 on the molding compound 160 between the connectors 200 by printing. In some embodiments, the polymeric dam structures 220 are arranged at outer sides of the connectors 200 (the outer sides are the sides further away from the first die 130), since the TIVs 120 and the connectors 200 are arranged to surround the first dies 130 located in the central region. In certain embodiment, the printing process includes an inkjet printing process. In certain embodiments, the polymeric cover films 210 and polymeric dam structures 220 may be formed in sequence or simultaneously by the same printing process using different materials.

As shown in FIGS. 3A & 1K-1L, in exemplary embodiments, the formation of the polymeric cover films 210 and polymeric dam structures 220 includes printing a first material M1 using a first printing dispenser 32 in the first regions A1 to form the polymeric cover films 210 and printing a second material M2 using a second printing dispenser 33 in the second regions A2 to form the polymeric dam structures 220. In one embodiment, the printing of the first material M1 and the second material M2 are performed at the same time and consecutively along a moving direction (such as direction D1 shown in FIG. 3A). In alternative embodiments, the printing of the first material M1 and the second material M2 are performed in turn, one after the other or one at a time.

Figure 3B:
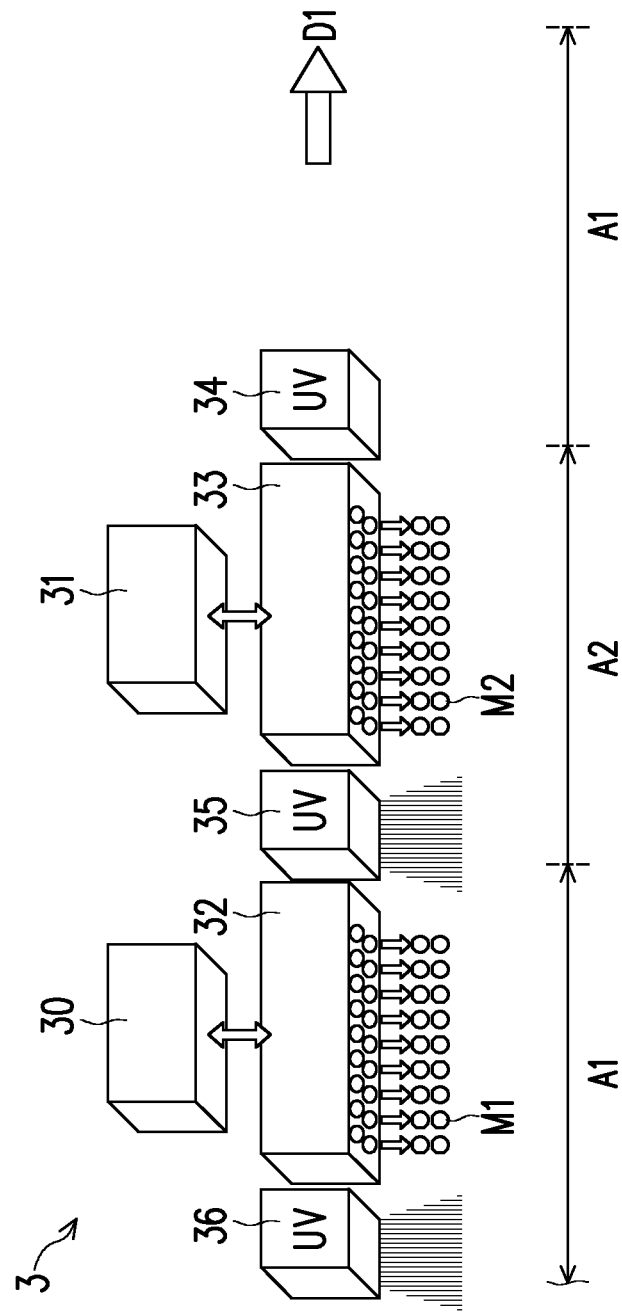

In some embodiments, as shown in FIGS. 3A-3B, a printing module 3 moves along a first direction D1 across the first and second regions A1, A2 of the whole package 100. In some embodiments, a first supply tank 30 for supplying the first material M1 is connected to the first printing dispenser 32 and the first material M1 is dispensed from the first printing dispenser 32 in the first regions A1 to form the polymeric cover films 210 (in FIG. 1K). In some embodiments, a second supply tank 31 for supplying the second material M2 is connected to the second printing dispenser 33 and the second material M2 is dispensed from the second printing dispenser 33 in the second regions A2 to form the polymeric dam structures 220 (in FIG. 1K). In exemplary embodiments, after the dispensers 32, 33 dispensing the first material M1 and the second material M2 respectively in the first region A1 and second region A2 at the same time, the curing units 36, 35 by the sides of the dispensers 32, 33 irradiates a light capable of curing the first and second materials M1, M2, such as UV rays (illustrated as straight lines in the figures), to cure the dispensed materials M1, M2 as the printing module 3 moves along the first direction D1 to the next position. In some embodiments, when moving in the first direction D1, the front most curing unit 34 may be turned off. Such printing and in-situ curing steps may be repeated a number of times to complete the printing of the first material M1 and the second material M2 to form the polymeric cover films 210 and polymeric dam structures 220.

Figure 3C:
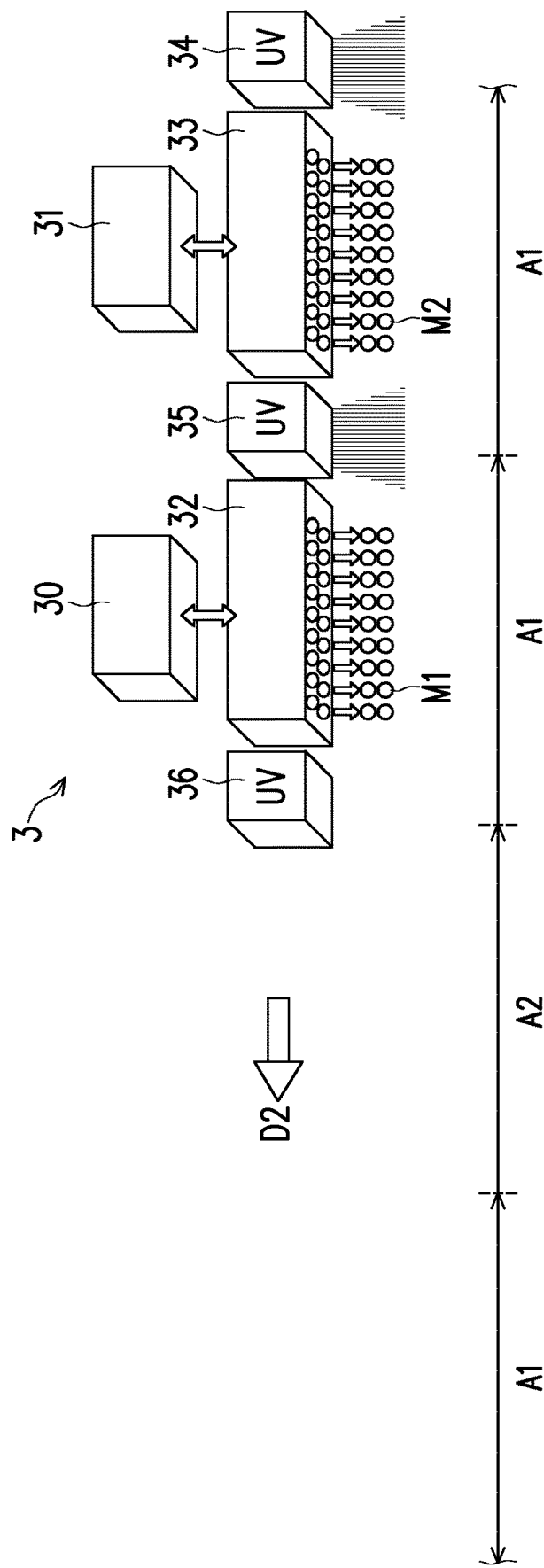
Figure 3D:
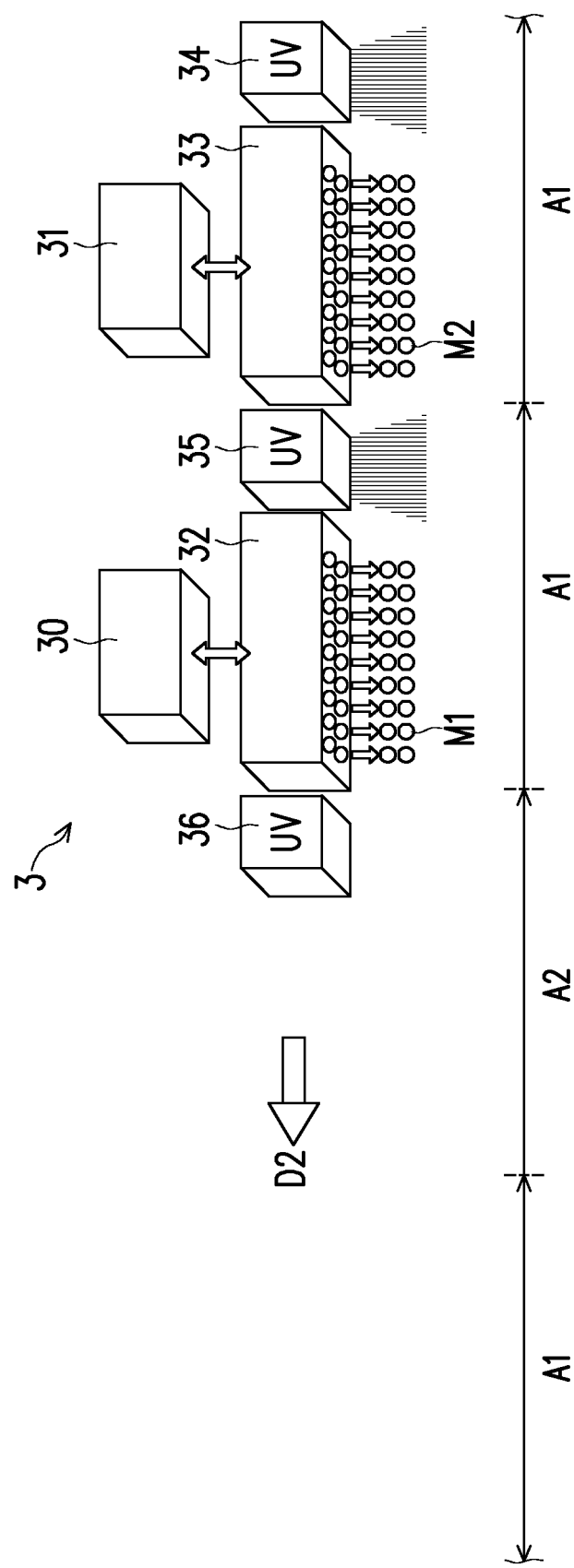

In alternative embodiments, the printing may be performed in one or more directions or even in opposite directions in turn. As shown in FIGS. 3C-3D, in some embodiments, the printing module 3 moves along a second direction D2, which is the opposite direction of D1. In exemplary embodiments, after the dispensers 32, 33 dispensing the first material M1 and the second material M2 respectively in the first region A1 and second region A2 at the same time, the curing units 35, 34 by the sides of the dispensers 32, 33 irradiates UV rays (illustrated as straight lines in the figures) to cure the dispensed materials M1, M2 as the printing module 3 moves along the second direction D2 to the next position. In some embodiments, when moving in the second direction D2, the front most curing unit 36 may be turned off. Such printing and in-situ curing steps may be repeated a number of times to complete the printing of the first material M1 and the second material M2 to form the polymeric cover films 210 and polymeric dam structures 220. By way of the arrangement of two dispensers sandwiched between three curing units in sequence (as seen in figures), the printing module can print more than one materials at the same time and/or print in different moving directions (i.e., moving back and forth, moving to the right or left) smoothly without standby for changing parts or printing heads.

Figure 4A:
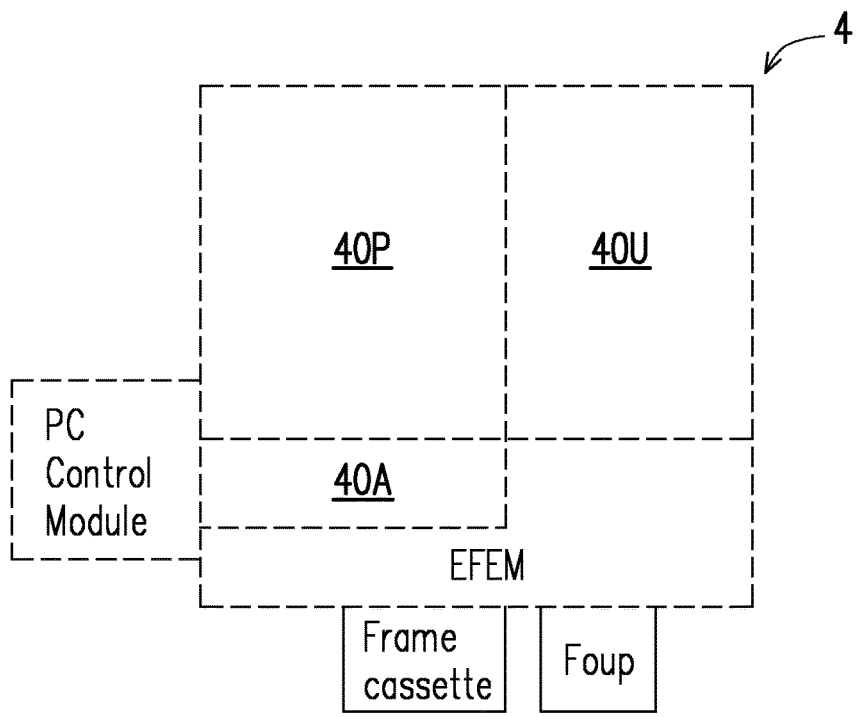
FIG. 4A is a layout diagram of a processing system according to some exemplary embodiments of the present disclosure.
Figure 4B:
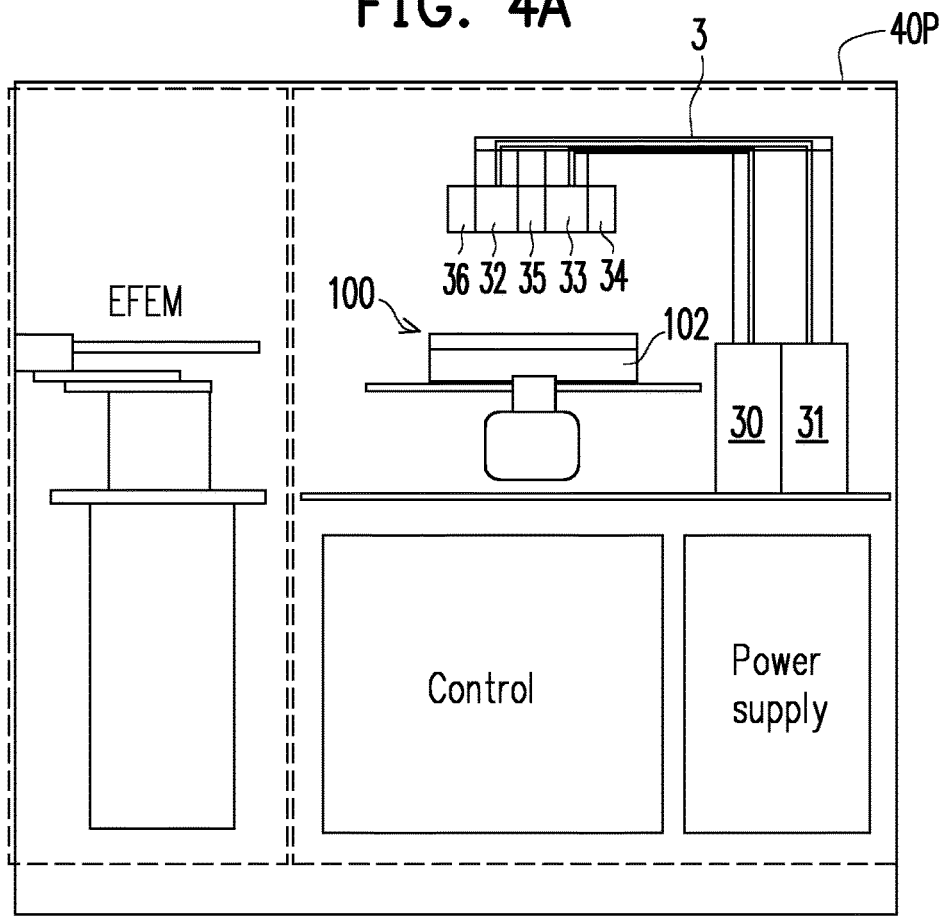
FIGS. 4B and 4C are schematic cross sectional views illustrating processing chambers of the processing system for the manufacturing of a semiconductor package according to some exemplary embodiments of the present disclosure.
Figure 4C:
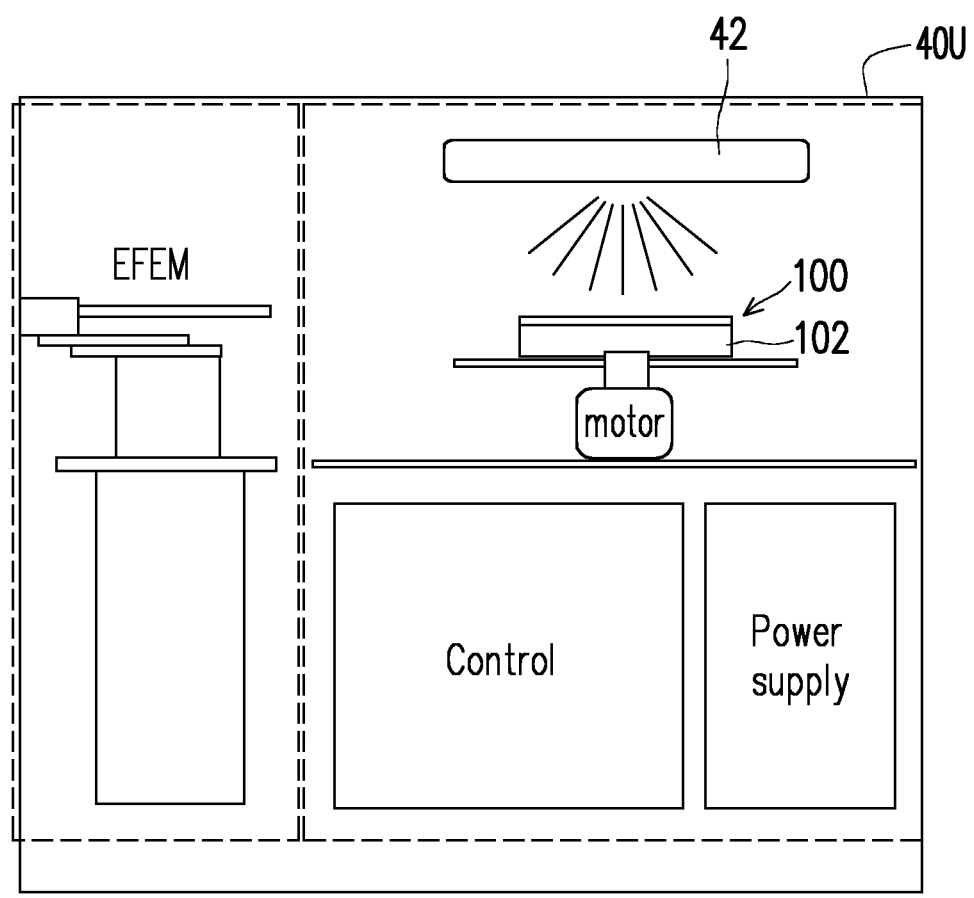

FIG. 4A is a schematic layout diagram of a processing system 4 according to some exemplary embodiments of the present disclosure. FIGS. 4B and 4C are schematic cross sectional views illustrating processing chambers of the processing system 4 for the manufacturing of a semiconductor package according to some exemplary embodiments of the present disclosure. In some embodiments, within the processing system 4, after providing the wafer carrier, the carrier along with the above dies or package structures are pre-aligned in the pre-align module 40A and then transferred to the printing and in-situ curing chamber 40P undergoing the above mentioned printing and in-situ curing steps. In some embodiments, within the same printing and in-situ curing chamber 40P, the printing and curing of different polymeric materials to form the polymeric cover film(s) and the polymeric dam structures are carried out. In addition, further curing or post-curing of the polymeric cover film(s) and the polymeric dam structures are executed in the post-curing chamber 40U.

In FIG. 4B, the printing module 3 is disposed within the printing and in-situ curing chamber 40P so that the printing and curing of the whole package 100 are performed in the same chamber, thus preventing particle contaminations during the transfer among chambers or within the system. In some embodiments, the printing module 3 includes a first supply tank 30 for supplying the first material M1 and a second supply tank 31 for supplying the second material M2. In some embodiments, the printing module 3 includes a first printing dispenser 32 and a second printing dispenser 33 sandwiched between three curing units 34, 35, 36 in sequence. In some embodiments, since at least two tanks and/or at least two printing dispensers are included for printing different polymeric materials, relatively high flexibility in choosing the materials and relatively high throughput for the printing may be achieved. In exemplary embodiments, the first and second printing dispensers 32, 33 and the curing units 34, 35, 36 may be arranged in a straight line along the moving direction. In some embodiments, the first printing dispenser 32 is connected with the first supply tank 30 and the first material M1 is dispensed from the first printing dispenser 32 in the first regions A1 to form the polymeric cover films 210 (in FIG. 1K). In some embodiments, the second supply tank 31 is connected with the second printing dispenser 33 and the second material M2 is dispensed from the second printing dispenser 33 in the second regions A2 to form the polymeric dam structures 220 (in FIG. 1K).

Referring to FIG. 4C, after being processed in the printing and in-situ curing chamber 40P, the package 100 is transferred to the post-curing chamber 40U undergoing the post-curing step. In some embodiments, a UV post-curing unit 42 is arranged in the post-curing chamber 40U and located above the package 100. In some embodiments the UV post-curing unit 42 includes elements with thermal curing function (such as heating elements or oven). It is understood that the processed package 100 may be further transferred to other system or platform for further packaging processing steps and the carrier may be recycled and go back to frame cassette or FOUP of the system.

Referring back to FIGS. 1K-1L, the connectors 200 are lower than polymeric dam structures 220 but higher than the polymeric cover films 210. In certain embodiments, tops 200a of the connectors 200 are lower than tops 220a of the polymeric dam structures 220 but are higher than top surfaces 210a of the polymeric over films 210. In some embodiments, the polymeric dams 220 have the same height as the polymeric cover films 210. In some embodiments, measuring from surface 160b of the molding compound 160, the polymeric dam structures 220 have a height H1 higher than the height of the connectors 200, and the height of the connectors 200 is higher than a height (or thickness) H3 of the polymeric cover films 210. In some embodiments, the height H1 of the polymeric dam structure 220 is the same as the height H3 of the polymeric cover films 210. In one embodiment, the polymeric dam structures 220 have a width W1 (width on the surface 160b of the molding compound 160) smaller or substantially equivalent to the pitch P1 of the connectors 200. In exemplary embodiments, the height H1 of the polymeric dam structures 220 ranges from about 10 microns to about 50 microns. In exemplary embodiments, the thickness H3 of the polymeric cover film 210 ranges from about 2 microns to about 50 microns. In exemplary embodiments, the ratio of the height H1 of the polymeric dam structures 220 to the height of the connectors 200 (H1/the height of the connector) is about 1.0 to about 2.0. In some embodiments, the ratio of the height H1 of the polymeric dam structures 220 to the height of the connectors is greater than 1.0 and less than about 2.0.

In certain embodiment, the polymeric dam structures 220 are wall-like structures or block structures arranged corresponding to the arrangement of the connectors 200. In exemplary embodiments, the connectors 200 are arranged in columns, rows or as rings and the polymeric dam structures 220 are arranged beside. In exemplary embodiments, when the connectors 200 are arranged in rows in the second region A2, the polymeric dam structures 220 are arranged as walls or block dams between the rows of the connectors 200 and beside the connectors 200, rather than encapsulating the connectors (see the partial enlarged top view of FIG. 1M). In FIG. 1M, it is unnecessary to have the polymeric dam structures arranged at the border between the first and second regions A1, A2 (at the inner sides of the connectors 200), as the package shall be diced at the second region(s) A2 and will not be cut between the first and second regions. In some embodiments, the polymeric cover film 210 arranged in the first region A1 is a die backside film, and the materials of the polymeric cover film 210 include polybenzooxazole ("PBO"), polyimide, epoxy resins and/or acrylic resins or the underfill, the mold compound. In some embodiments, the materials of polymeric dam structures 220 include PBO, polyiemide, epoxy resins and/or acrylic resins or the underfill, the mold compound. In some embodiments, the material of the polymeric cover film 210 has high glass transition temperature (Tg) and high modulus, beneficial for preventing warpage. In some embodiments, the material of the polymeric dam structure 220 has high Tg and high surface tension, beneficial for forming the stable dam structures for blocking out the sawing debris. By choosing different materials for forming the polymeric cover films 210 and polymeric dam structures 220, higher flexibility in the choices of materials aiming at specific functions and/or compatible process steps or conditions is offered.

In exemplary embodiments, the manufacturing method described above is part of a wafer level packaging process, and the whole package 100 including plural package units 10 may be further mounted with additional packages, dies or other electronic devices.

Figure 2A:
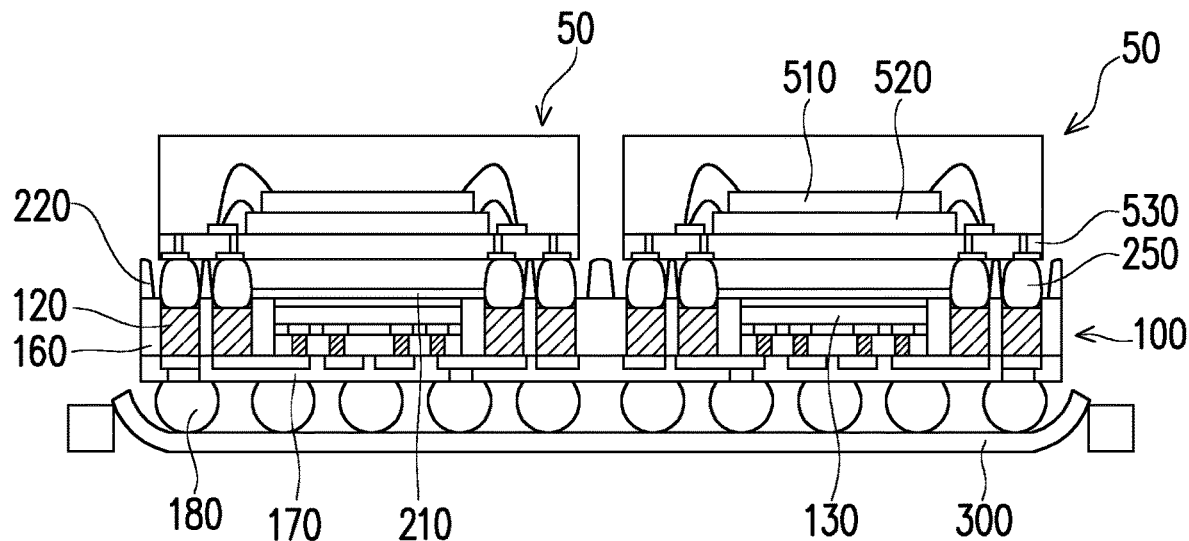
FIG. 2A to FIG. 2D are schematic cross sectional views illustrating a semiconductor package at various stages of the manufacturing method according to some exemplary embodiments of the present disclosure.

FIG. 2A-2D are schematic cross sectional views illustrating a semiconductor package at various stages of the manufacturing method according to some exemplary embodiments of the present disclosure. The package 100 of FIG. 2A may be fabricated following the previously described manufacturing process as described in FIG. 1A-1L. The elements similar to or substantially the same as the elements described in FIG. 1A-1L will use the same reference numbers, and certain details or descriptions of the same elements will not be repeated herein. Referring to FIG. 2A, in some embodiments, after the formation of the polymeric cover films 210 and polymeric dam structures 220, one or more second semiconductor packages 50 are provided and joined onto the whole package 100 (including plural package units 10). In exemplary embodiments, the second semiconductor package 50 includes stacking dies 510, 520, at least one redistribution layer 530 electrically connecting with the dies 510, 520 and solder balls (not shown) located on the redistribution layer 530. In some embodiments, a reflow process is performed and the packages 50 are joined to the package 100 by forming connection structures 250 (i.e., joined solder balls). In one embodiment, during the reflow process, the connectors 200 are melted and joined with the solder paste of the packages 50 to form the connection structures 250. In one embodiment, the connection structure 250 may be regarded as the reflowed connectors. Through the connection structures 250, the second semiconductor packages 50 are physically and electrically connected with the package 100. In some embodiments, at least one of the dies 510, 520 is electrically connected with the conductive elements 180 and/or the die 130 through the redistribution layers 170, 530, the connection structures 250 and the TSVs 120. In some embodiments, an epoxy flux 252 (FIG. 2D) may be present on the connection structures 250 as the flux is applied to the solder paste of the packages 50 before the reflow process. In some embodiments, an underfill (not shown) may be applied to fill the gap between package 50 and package 100.

Figure 2B:
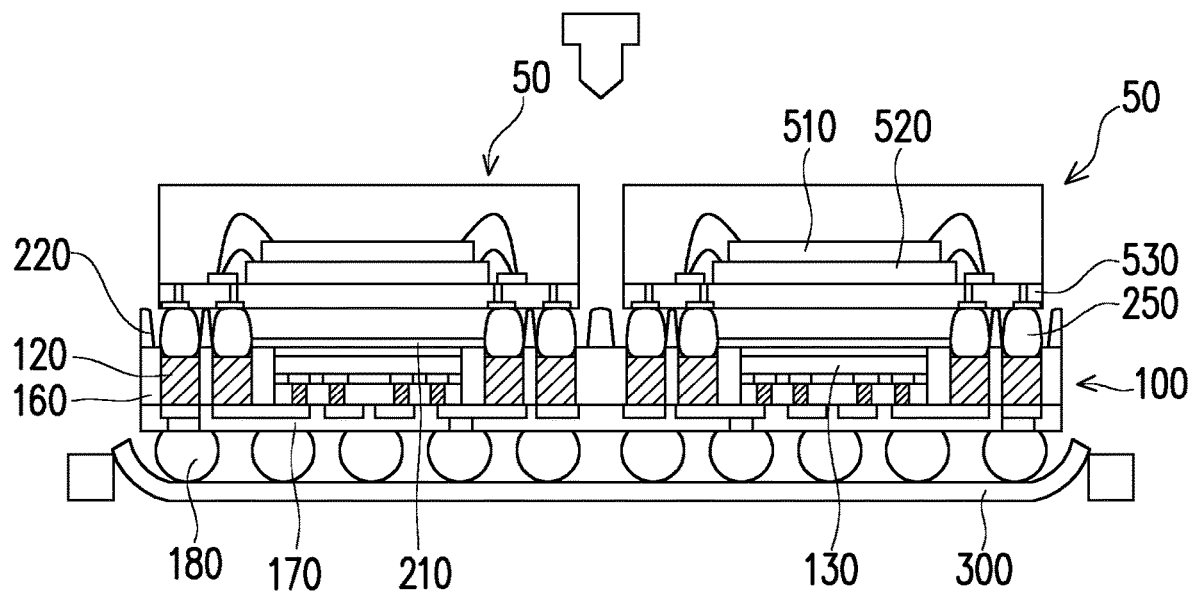
Figure 2C:
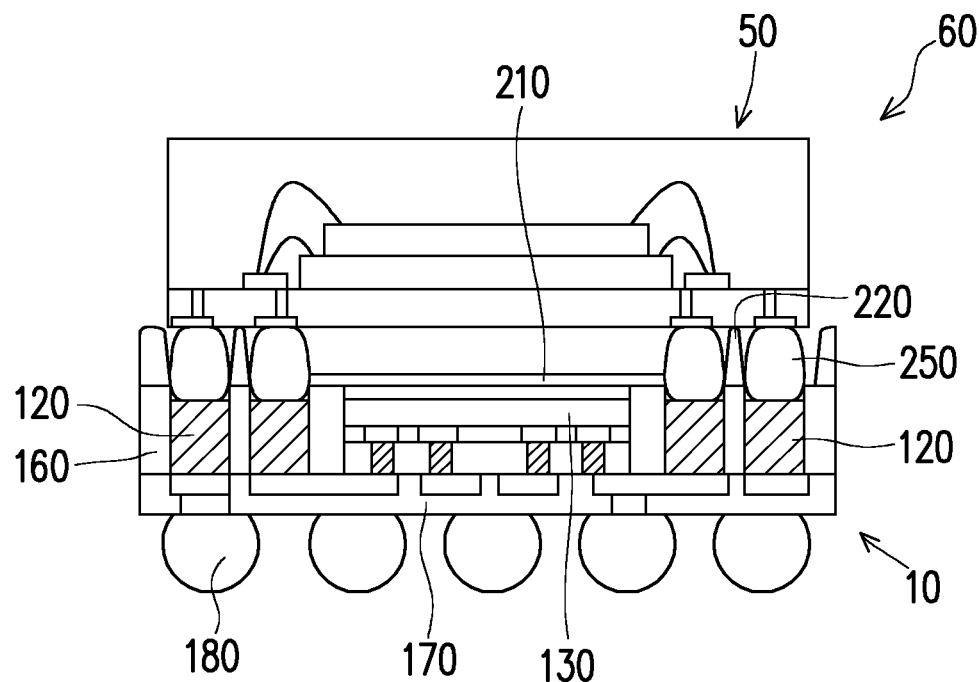

Referring to FIG. 2B, a dicing process is performed to cut the whole package 100 (at least cutting though the molding compound 160 and the polymeric dam structures 220) and possibly the underfill along the cutting line (the dotted line) into individual and separated semiconductor packages 60 (in FIG. 2C). In one embodiment, the dicing process is a wafer dicing process including mechanical blade sawing or laser cutting. In some embodiments, as the polymeric dam structures 220 are arranged between the connectors 200 (between the connection structures 250 as well), cutting debris are kept away from the connection structures 250 during the dicing process, thus avoiding electrical failure of the package caused by saw debris and improving the product reliability and yield. In some embodiments, the semiconductor packages 60 are obtained without using an underfill material filled between the second semiconductor packages 50 and the package 100. In some embodiment, the semiconductor package 60 are obtained with the underfill filled between the package 50 and the package 100. In FIG. 2C, in some embodiments, the diced packages 60 are package-on-package structures (POP).

Figure 2D:
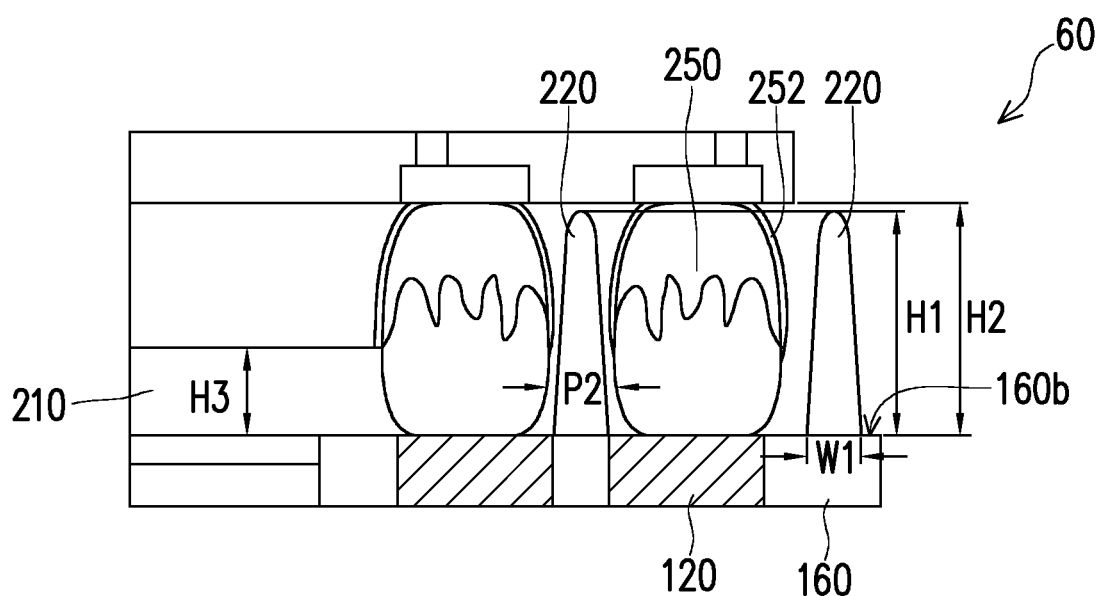

FIG. 2D shows a schematic partially enlarged cross-sectional view of a portion of the diced package 60. In FIG. 2D, in certain embodiment, measuring from the surface 160b of the molding compound 160, the height H1 of the polymeric dam structures 220 is substantially equivalent to or slightly smaller than the standoff height H2 of the connection structures 250 and is larger than the height (thickness) H3 of the polymeric cover films 210. In one embodiment, the width W1 of the polymeric dam structures 220 is smaller than or substantially equivalent to the pitch P2 of the connection structures 250.

In some embodiments, omitting the lamination of blanket backside film, the package 60 locally formed with the polymeric cover film(s) 210 and polymeric dam structures 220 has better product reliability and a robust structure with less warpage. By applying the disclosed manufacturing methods, the polymeric cover film 210 formed locally on the backside of the package unit 10 helps to prevent warpage and the polymeric dam structures 220 arranged beside the connection structures 250 kept debris away from the packages so that the electrical failure caused by the sawing debris is prevented and better product reliability can be achieved.

Referring to FIGS. 2C & 2D, the semiconductor package 60 includes at least one package 50, the connection structures 250 and the package unit 10, and the at least one package 50 is disposed on the package 10 with the connection structures 250 located there-between.

FIG. 1L' is a schematic cross sectional view of the diced package according to some exemplary embodiments. In some embodiments, as shown in FIG. 1L', the whole package 100 may be diced into plural package units 10. The package unit 10 itself is in fact a package structure but may be joined with other elements, devices or packages to form a package-on-package (POP) structure. In some embodiments, as shown in FIG. 1L', before mounting with other devices or packages, the package 10 includes the first die 130, the TIVs 120, the molding compound 160, the redistribution layer 170 and the conductive elements 180, the connectors 200, the polymeric cover film 210 and the polymeric dam structures 220. In some embodiments, the first die 130 and the TIVs 120 are located on the redistribution layer 170 and are electrically connected to the redistribution layer 170, while the molding compound 160 located on the redistribution layer 170 encapsulates the first die 130 and the TIVs 120. In some embodiments, the connectors 200 are respectively located on the TIVs 120 in the second regions A2. In some embodiments, the polymeric cover film 210 is disposed on the molding compound 160 and on the first die 130 in the first region A1. In some embodiments, the polymeric dam structures 220 are disposed on the molding compound and arranged beside the connectors 200 and between the connectors in the second region A2. In some embodiments, the first die 130 and the molding compound 160 in the first region A1 are sandwiched between the polymeric cover film 210 and the redistribution layer 170. In some embodiments, the TIVs 120 and the molding compound 160 in the second region A2 are sandwiched between the connectors 200, the polymeric dam structures 220 and the redistribution layer 170. In certain embodiment, the TIVs 120 penetrating through the molding compound 160 are arranged aside the first die 130. In certain embodiment, the connectors 200 are lower than the polymeric dam structures 220 as illustrated in FIG. 1L'.

In some embodiments, the package 10 may be an intermediate structure and may be further packaged with another package(s) and/or additional dies over the first die 130, and one or more redistribution layer(s) may be adjusted to electrically connect another package(s) and/or the additional dies. The structures and/or the process of the present disclosure shall not be limited by the exemplary embodiments.

According to some embodiments, a semiconductor package has at least one die, a molding compound, through interlayer vias, a polymeric cover film, polymeric dam structures and connectors. The at least one die is encapsulated by the molding compound. The through interlayer vias are arranged beside the at least one die and penetrate the molding compound. At least one of the through interlayer vias is electrically connected to the at least one die. The polymeric cover film is disposed on the molding compound and on the at least one die. The connectors are disposed on the through interlayer vias. The polymeric dam structures are disposed on the molding compound and located beside and between the connectors. Tops of the polymeric dam structures are higher than tops of the connectors, and the polymeric cover film is made of a material different from that of the polymeric dam structures.

According to some embodiments, a manufacturing method for semiconductor packages is provided. Through interlayer vias are formed on a carrier. A plurality of dies is disposed on the carrier and aside the through interlayer vias. A molding compound is formed over the carrier to encapsulate the plurality of dies and the through interlayer vias. The carrier is detached from the molding compound so as to expose the through interlayer vias. Connectors are formed on the through interlayer vias. Polymeric cover films are formed over the molding compound and on the plurality of dies. Polymeric dam structures are formed on the molding compound, around and between the connectors. A dicing process is performed cutting through the molding compound to separate the semiconductor packages.

According to some embodiments, a printing module is provided. The printing module comprises a first printing dispenser and a second printing dispenser and a first curing unit, a second curing unit and a third curing unit. The first and second printing dispensers are operable to dispense a first material and a second material respectively. Each of the first, second and third curing units is operable to irradiate a light capable of curing the first and second materials. The first, second and third curing units are alternately arranged with the first and second printing dispensers along a line. The first printing dispenser is sandwiched between the first and second curing units, and the second printing dispenser is sandwiched between the second and third curing units. The first and second dispensers and the first, second and third curing units are simultaneously movable along the line. When the printing module moves in a first direction along the line, the first curing unit is off, the first and second dispensers are operable to dispense the first and second materials at corresponding positions of a workpiece, and the second and third curing units are operable to irradiate the light at the corresponding positions of the workpiece to cure the dispensed first and second materials. When the printing module is moving in a second direction opposite to the first direction, the third curing unit is off, the first and second printing dispensers are operable to dispense the first and second materials at corresponding positions of the workpiece and the first and second curing units are operable to irradiate the light at the corresponding positions of the workpiece to cure the first and second materials. The printing module may further includes a first supply tank and a second supply tank.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A printing apparatus, comprising:
a first printing dispenser operable to dispense a first material;
a second printing dispenser operable to dispense a second material;
a first curing device, a second curing device and a third curing device each being operable to irradiate a light capable of curing the first and second materials, wherein the first, second and third curing devices are alternately arranged with the first and second printing dispensers along a line, the first printing dispenser is sandwiched between the first and second curing devices, and the second printing dispenser is sandwiched between the second and third curing devices; and
a controller that makes the first curing device, the second curing device, and the third curing device operable to irradiate the light,
wherein the first and second printing dispensers and the first, second and third curing devices are simultaneously movable along the line, and
wherein during the second curing device and one of the first curing device and the third curing device are operable to irradiate the light, the other of the first curing device and the third curing device is off.

2. The printing apparatus of claim 1, wherein when the first and second printing dispensers and the first, second and third curing devices move in a first direction along the line, the first curing device is off, the first and second printing dispensers are operable to dispense the first and second materials at corresponding positions of a workpiece, and the second and third curing devices are operable to irradiate the light at the corresponding positions of the workpiece to cure the dispensed first and second materials.

3. The printing apparatus of claim 2, wherein, when the first and second printing dispensers and the first, second and third curing devices move in a second direction opposite to the first direction, the third curing device is off, the first and second printing dispensers are operable to dispense the first and second materials at corresponding positions of the workpiece and the first and second curing devices are operable to irradiate the light at the corresponding positions of the workpiece to cure the first and second materials.

4. The printing apparatus of claim 1, further comprising a first supply tank connected to the first printing dispenser for supplying the first material and a second supply tank connected to the second printing dispenser for supplying the second material.

5. The printing apparatus of claim 1, wherein the first and second printing dispensers are operable to dispense the first and second materials followed by the second curing device and the one of the first curing device and the third curing device being operable to irradiate the light.

6. The printing apparatus of claim 1, wherein the second curing device and the one of the first curing device and the third curing device are operable to irradiate the light during the first and second printing dispensers and the first, second and third curing devices are moving along the line.

7. A printing method, comprising:
placing a workpiece below a printing apparatus, wherein the printing apparatus comprises:
a first printing dispenser operable to dispense a first material;
a second printing dispenser operable to dispense a second material;
a first curing device, a second curing device, and a third curing device, wherein the first, second and third curing devices are alternately arranged with the first and second printing dispensers along a line, the first printing dispenser is sandwiched between the first and second curing devices, and the second printing dispenser is sandwiched between the second and third curing devices; and
a controller that makes the first curing device, the second curing device, and the third curing device operable to irradiate light;
printing the first material on a first region of the workpiece with the first printing dispenser and printing the second material on a second region of the workpiece with the second printing dispenser;
subsequent to the printing, moving the first and second printing dispensers and the first, second and third curing devices along the line; and
irradiating a light to the dispensed first material on the first region and the dispensed second material on the second region with the second curing device and the one of the first curing device and the third curing device and turning off the other of the first curing device and the third curing device.

8. The printing method of claim 7, wherein the first and second printing dispensers and the first, second and third curing devices are moving along the line in a first direction, and the third curing device is off.

9. The printing method of claim 8, wherein the first and second printing dispensers and the first, second and third curing devices are moving along the line in a second direction opposite to the first direction, and the first curing device is off.

10. The printing method of claim 7, wherein the second curing device and the one of the first curing device and the third curing device irradiate the light during the first and second printing dispensers and the first, second and third curing devices are moving along the line.

11. The printing method of claim 7, wherein the second curing device and the one of the first curing device and the third curing device irradiate the light after moving the first and second printing dispensers and the first, second and third curing devices along the line to a position next to a position of the printing.

12. The printing method of claim 7, wherein the first printing dispenser and the second printing dispenser dispense the first material and the second material at the same time.

13. The printing method of claim 7, wherein the first printing dispenser and the second printing dispenser dispense the first material and the second material in turn.

14. The printing method of claim 7, wherein the first material and the second material are different.

15. The printing method of claim 7, further transferring the workpiece to a post-curing chamber and performing a post-curing step on the dispensed first material and the dispensed second material.

16. The printing method of claim 7, wherein the post-curing step is performed by a UV post-curing device arranged in the post-curing chamber.

17. A system of forming a printed structure on a workpiece, comprising:
a printing and in-situ curing chamber with a printing apparatus arranged in the printing and in-situ curing chamber, wherein the printing apparatus comprises:
a first printing dispenser operable to dispense a first material;
a second printing dispenser operable to dispense a second material;
a first curing device, a second curing device, and a third curing device, wherein the first, second and third curing devices are alternately arranged with the first and second printing dispensers along a line, the first printing dispenser is sandwiched between the first and second curing devices, and the second printing dispenser is sandwiched between the second and third curing devices; and
a post-curing chamber with a post-curing device arranged in the post-curing chamber, wherein the workpiece processed in the printing and in-situ curing chamber is transferred to the post-curing chamber.

18. The system of claim 17, wherein the first and second printing dispensers and the first, second and third curing devices are moving along the line in a first direction, and the third curing device is off.

19. The system of claim 18, wherein the first and second printing dispensers and the first, second and third curing devices are moving along the line in a second direction opposite to the first direction, and the first curing device is off.

20. The system of claim 18, wherein the post-curing device is a UV post-curing device.

* * * * *